United States Patent
Braceras et al.

(10) Patent No.: US 9,437,282 B1
(45) Date of Patent: Sep. 6, 2016

(54) HIGH PERFORMANCE SENSE AMPLIFIER

(71) Applicant: GLOBALFOUNDRIES Inc., George Town (KY)

(72) Inventors: George M. Braceras, Essex Junction, VT (US); Venkatraghavan Bringivijayaraghavan, Tamilnadu (IN); Krishnan S. Rengarajan, Bangalore (IN)

(73) Assignee: GLOBALFOUNDRIES INC., George Town (KY)

( * ) Notice: Subject to any disclaimer, the term of this patent is extended or adjusted under 35 U.S.C. 154(b) by 0 days.

(21) Appl. No.: 14/819,784

(22) Filed: Aug. 6, 2015

(51) Int. Cl.
*G11C 7/00* (2006.01)
*G11C 11/419* (2006.01)

(52) U.S. Cl.
CPC .................... *G11C 11/419* (2013.01)

(58) Field of Classification Search
CPC . G11C 11/41; G11C 11/419; G11C 11/5642; G11C 7/10; G11C 7/103; G11C 7/1033; G11C 7/1036; G11C 7/1051; G11C 7/06
USPC ........................ 365/205, 154, 156
See application file for complete search history.

(56) References Cited

U.S. PATENT DOCUMENTS

| | | | |
|---|---|---|---|
| 4,843,264 A | 6/1989 | Galbraith | |
| 5,949,256 A | 9/1999 | Zhang et al. | |
| 6,184,722 B1 | 2/2001 | Hayakawa | |
| 6,218,892 B1 | 4/2001 | Soumyanath et al. | |
| 6,566,914 B2 | 5/2003 | Bruneau et al. | |
| 6,798,704 B2 * | 9/2004 | Chen ...................... | G11C 7/062 365/154 |
| 7,053,668 B2 | 5/2006 | Nakazato et al. | |
| 8,199,596 B2 | 6/2012 | Akiyama et al. | |

* cited by examiner

*Primary Examiner* — Huan Hoang

(74) *Attorney, Agent, or Firm* — Anthony Canale; Andrew M. Calderon; Roberts Mlotkowski Safran Cole & Calderon, P.C.

(57) ABSTRACT

A sense amplifier device for sensing a differential signal produced by a memory cell includes a first n-type metal-oxide-semiconductor field-effect transistor (NMOS) stack having multiple NMOS devices sharing a gate connection connected to a complementary data line; and a second NMOS stack having multiple NMOS devices sharing a gate connection connected to a true data line. At least one of the devices in the first stack has higher gate-to-source and drain-to-source voltages than a gate-to-source and drain-to-source voltages of at least one device in the second stack when the voltage of the complementary data line is higher than the true data line. At least one of the devices in the second stack has a higher gate-to-source and drain-to-source voltages than the gate-to-source and drain-to-source voltages of at least one device in the first stack when the voltage of the true data line is higher than the complementary data line.

20 Claims, 3 Drawing Sheets

| Device | $X_0$ | $X_1$ | $X_2$ | $X_3$ | $X_4$ |
|--------|-------|-------|-------|-------|-------|
| T4 | O | O | SO | SL | L |
| T6 | S | DS | S | L | L |
| T3 | O | DO | O | O | DO |
| T5 | S | SS | DS | SO | O |
| T7 | O | O | L | L | L |

| | |
|---|---|
| L | Linear Region |
| DL | Deep Linear |
| SL | Shallow Linear |
| SL | Saturation Region |
| DS | Deep Saturation |
| SS | Shallow Saturation |
| O | Off |
| DO | Deep Off |
| SO | Shallow Off |

FIG. 2

US 9,437,282 B1

HIGH PERFORMANCE SENSE AMPLIFIER

FIELD OF THE INVENTION

The invention relates to semiconductor structures and, more particularly, to sense amplifier circuits.

BACKGROUND

A sense amplifier is part of read circuitry on an integrated circuit (IC), and is used when data is read from memory on the integrated circuit. During a memory access cycle, a differential signal is generated by a memory cell. For example, the differential signal is represented by a difference in voltage between data lines. The sense amplifier senses and amplifies the differential signal to recognizable logic levels so the data can be interpreted properly by logic outside the memory.

Sense amplifiers can be error-prone, whereby the differential signal is not always sensed. For example, the difference in voltages between data lines can be extremely minuscule to the point where the sense amplifier may not always properly sense this difference in voltage. Increasing the length of a channel in a sense amplifier may improve the sensing reliability, however, increasing the length in the channel leads to slower amplifier performance.

SUMMARY

In an aspect of the invention, a sense amplifier device includes: a first n-type metal-oxide-semiconductor field-effect transistor (NMOS) stack having a plurality of NMOS devices sharing a gate connection connected to a complementary data line; and a second NMOS stack having a plurality of NMOS devices sharing a gate connection connected to a true data line. At least one of the NMOS devices in the first NMOS stack has a higher gate-to-source voltage and a higher drain-to-source voltage than a gate-to-source voltage and a drain-to-source voltage of at least one of the NMOS devices in the second NMOS stack when the voltage of the complementary data line is higher than the voltage of the true data line. The at least one of the NMOS devices in the second NMOS stack has a higher gate-to-source voltage and a higher drain-to-source voltage than the gate-to-source voltage and the drain-to-source voltage of the at least of the NMOS device in the first NMOS stack when the voltage of the true data line is higher than the voltage of the complementary data line.

In an aspect of the invention, a sense amplifier device for sensing a differential signal produced by a memory cell includes: a first n-type metal-oxide-semiconductor field-effect transistor (NMOS) stack having two NMOS devices sharing a gate connection connected to a complementary data line; and a second NMOS stack having two NMOS devices sharing a gate connection connected to a true data line. One of the NMOS devices in the first NMOS stack has a higher gate-to-source voltage and a higher drain-to-source voltage than a gate-to-source voltage and a drain-to-source voltage of at least one of the NMOS devices in the second NMOS stack when the voltage of the complementary data line is higher than the voltage of the true data line. One of the NMOS devices in the second NMOS stack has a higher gate-to-source voltage and a higher drain-to-source voltage than a gate-to-source voltage and a drain-to-source voltage of at least one of the NMOS devices in the first NMOS stack when the voltage of the true data line is higher than the voltage of the complementary data line.

In an aspect of the invention, [to be completed after finalizing claims, a first n-type metal-oxide-semiconductor field-effect transistor (NMOS) stack having exactly two NMOS devices sharing a gate connection connected to a complementary data line; a second NMOS stack having exactly two NMOS devices sharing a gate connection connected to a true data line; a first p-type metal-oxide-semiconductor field-effect transistor (PMOS) device connected to the two NMOS devices in the first NMOS stack configured to hold a voltage on a node associated with the first NMOS stack; and a second PMOS device connected to the two NMOS devices in the second NMOS stack configured to hold a voltage on a node associated with the second NMOS stack. One of the NMOS devices in the first NMOS stack has a higher gate-to-source voltage and a higher drain-to-source voltage than a gate-to-source voltage and a drain-to-source voltage of at least one of the NMOS devices in the second NMOS stack when the voltage of the complementary data line is higher than the voltage of the true data line. One of the NMOS devices in the second NMOS stack has a higher gate-to-source voltage and a higher drain-to-source voltage than a gate-to-source voltage and a drain-to-source voltage of at least one of the NMOS devices in the first NMOS stack when the voltage of the true data line is higher than the voltage of the complementary data line.

BRIEF DESCRIPTION OF THE DRAWINGS

The present invention is described in the detailed description which follows, in reference to the noted plurality of drawings by way of non-limiting examples of exemplary embodiments of the present invention.

FIG. 2 shows a table of device states during operation of the sense amplifier of FIG. 1 in accordance with aspects of the present invention.

DETAILED DESCRIPTION

Figure 1:
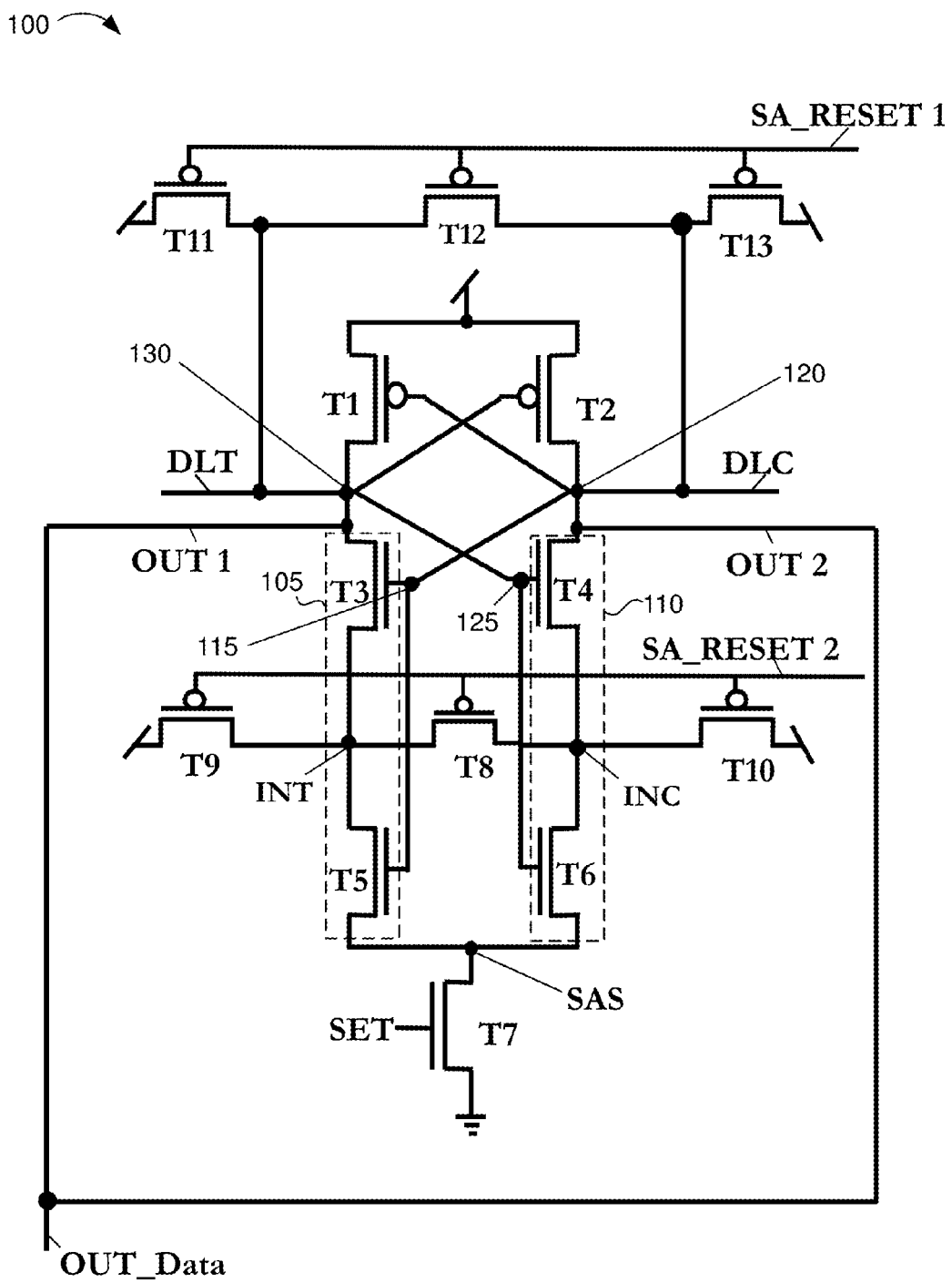
FIG. 1 shows an example sense amplifier in accordance with aspects of the present invention.

The invention relates to semiconductor structures and, more particularly, to sense amplifier circuits. More specifically, the present invention relates to sense amplifiers having stacked sensing devices. In accordance with aspects of the present invention, a sense amplifier includes stacked metal-oxide-semiconductor field-effect transistor (MOSFET) devices, such as n-channel MOSFET (NMOS) devices. By way of non-limiting illustrative example, the sense amplifier may include a first NMOS stack and a second NMOS stack. Devices in the first NMOS stack share a gate connection, which is connected to a complementary data line (DLC) connected to a memory cell, such as a memory cell associated with a static random access memory (SRAM) device. Devices in the second NMOS stack share a gate connection, which is connected to a true data line (DLT) connected to the memory cell. This effectively forms a cross-coupled pair of NMOS devices that operate with the performance characteristics of a single longer channel length device.

The sense amplifier may further include primary and secondary pre-charge p-channel MOSFET (PMOS) devices. The secondary pre-charge PMOS devices provide equalization to the intermediate nodes in the sense amplifier. Devices in the first NMOS stack are further cross-coupled to a PFET associated with the second NMOS stack, with a common gate connection to the DLC. Devices in the second NMOS stack are further cross-coupled to a PFET associated with the first NMOS stack, with a common gate connection to the DLT.

The sense amplifier senses a differential signal represented by differences in the voltages between the DLT and DLC. For example, a differential signal is produced by the memory cell via differences in voltages between the DLT and DLC. As described herein, the DLT and DLC data lines may be pre-charged, and, during a sensing operation, the pre-charging is discontinued. The memory cell produces a voltage difference between the DLT and DLC depending on the data to be conveyed. For example, for a binary bit of 1, the memory cell produces a differential voltage so that the voltage on the DLT is higher than the voltage on the DLC. For a binary bit of 0, the memory cell produces a differential voltage so that the voltage on the DLC is higher than the voltage on the DLT.

The NMOS stacks lengthen the sensing channel in the sense amplifier, thereby improving sensing reliability. For example, the longer channel length reduces mismatch during the fabrication process. As a non-limiting example, a 1 nanometer (nm) mismatch in a 20 nm channel would be a 5% mismatch, whereas a 1 nm mismatch in a 10 nm channel would be a 10% mismatch. In accordance with aspects of the present invention, the sense amplifier increases amplification performance and speed, as a sensing NMOS transistor, driven by a higher voltage from either the DLT or DLC, has a higher drain-to-source voltage $V_{DS}$ and a higher gate-to-source $V_{GS}$ voltage than its opposing transistor, whereas in conventional sense amplifiers, only the $V_{GS}$ is higher. Thus, amplification speed does not suffer from the lengthened channel, whereas sensing reliability is improved by the longer sensing channel. Moreover, sensing reliability is improved, since a threshold difference in voltages between the DLT and DLC that is detected is lower than conventional sense amplifiers, as a result of both the higher drain-to-source voltage $V_{DS}$ and the higher gate-to-source voltage $V_{GS}$. Also, sensing reliability is improved since both $V_{DS}$ and $V_{GS}$ voltages are higher, thus eliminating a conflict in traditional sense amplifiers in which the $V_{GS}$ is higher, but the $V_{DS}$ is lower.

FIG. 1 shows an example sense amplifier in accordance with aspects of the present invention. As shown in FIG. 1, a sense amplifier 100 connects to a DLT and a DLC. The DLT and DLC connect to a memory cell, such as a memory cell of an SRAM device. A differential signal is represented by a difference in voltages between the DLT and DLC. As described herein, the differential signal is sensed by the sense amplifier 100, and is converted into a logical signal interpretable by logic components outside of the sense amplifier 100. As an example, if the voltage of the DLT is higher than the voltage of the DLC, a logical bit of "1" is output by the sense amplifier 100, whereas if the voltage of the DLC is higher than the voltage of the DLT, a logical bit of "0" is output by the sense amplifier 100.

The sense amplifier 100 includes NMOS and PMOS devices to sense the difference between the voltages of the DLT and DLC. For example, the sense amplifier 100 may include a first NMOS stack 105 having NMOS devices (e.g., n-type field effect transistors (NFETs)) T3 and T5. As shown in FIG. 1, the devices in the first NMOS stack 105 share a gate connection 115 which is connected to the DLC at a node 120.

The sense amplifier 100 may further include a second NMOS stack 110 having NMOS devices T4 and T6. The NMOS devices in the second NMOS stack 110 share a gate connection 125 which is connected to the DLT at a node 130.

The first NMOS stack 105 and the second NMOS stack 110 together form the sensing portion of the sense amplifier 100. NMOS devices T3 and T5 connect via a "true" intermediate node INT, and NMOS devices T4 and T6 connect via a "complementary" intermediate node INC.

Secondary pre-charge PMOS devices T8, T9, and T10 are connected in series between the NMOS devices in the first and second NMOS stacks 105, 110. The secondary pre-charged PMOS devices T8, T9, and T10 are pre-charged via "SA_RESET 2" line and equalize or pre-charge the intermediate nodes INT and INC, e.g., to a voltage $V_{DD}$. NMOS devices T3 and T5 of the first NMOS stack 105 are further cross-coupled to a p-type field effect transistor (PFET) T2 associated with the second NMOS stack 110 with a common gate connection. NMOS devices T4 and T6 of the second NMOS stack 110 are further cross-coupled to a PFET T1 associated with the first NMOS stack 105 with a common gate connection. Primary pre-charge PMOS devices T11, T12, and T13 are pre-charged via "SA_RESET 1" line and equalize or pre-charge the DLT and DLC, e.g., to a voltage $V_{DD}$.

When a read cycle begins, e.g., in a memory cell connected to the sense amplifier 100, the memory cell begins to develop a voltage differential on the DLT and DLC. The operation of the sense amplifier 100 begins when a SET line goes high, e.g., is activated, causing a sense amplifier start (SAS) node to be pulled down to ground. Also, when the SET line goes high, the primary pre-charge PMOS devices T11, T12, and T13, and the secondary pre-charge PMOS devices T8, T9, and T10 are turned off.

In an illustrative example, assume that the DLC is being discharged from its pre-charge level (e.g., the data from the memory cell corresponds to a binary bit of 1). Given this assumption, the NMOS device T6 will turn on (begin conducting) before the NMOS device T5, when the SAS node is pulled down. Further, the voltage at the INC node will remain higher than the voltage at INT node due to bias differences present on the NMOS devices T3 and T4. As a result, the NMOS device T6 has a higher $V_{GS}$, than the opposing NMOS device T5, e.g., since the gate of the NMOS device T6 is connected to the DLT. Further, the NMOS device T6 has a higher $V_{DS}$ than the opposing NMOS device T5, since the voltage at the INC node is higher than the voltage at the INT node. Since the NMOS device T6 has both a higher $V_{GS}$ and $V_{DS}$, the NMOS device T6 more drive current than conventional sense amplifiers in which only the $V_{GS}$ is higher than its opposing device, thereby speeding up the amplification process.

After a period of time from when the SET line goes high, the NMOS device T5 may discharge and no longer conduct. The voltage across the NMOS device T3 produces a voltage at the OUT 1 line, and the voltage across the NMOS device T4 produces a voltage at the OUT 2 line As the NMOS device T4, T5 is discharged, the voltage at the OUT 2 line gradually reduces, thereby reinforcing the voltage difference between the OUT 1 line and the OUT 2 line. The voltage differential between OUT 1 line and OUT 2 line, in turn, is represented by a logical bit and transmitted via the OUT data line.

In embodiments, the OUT 1 and the OUT 2 lines may connect to various devices that have not been shown for clarity. For example, the OUT 1 and/or the OUT 2 lines may connect to NMOS and PMOS devices not shown in FIG. 1. Additionally, or alternatively, the devices not shown and connected to the OUT 1 and/or the OUT 2 lines may be connected to one or more of the devices shown in FIG. 1. For example, the OUT 1 and/or OUT 2 lines may be connected to conventional devices found in sense amplifier devices.

As described herein, the sense amplifier 100 has a higher reliability than conventional sense amplifiers due to the longer sensing channel length. Further, the increased amplification, as a result of a higher VGS and a higher VDS improves the amplification speed to overcome the longer sensing channel.

FIG. 2 shows device states during operation of the sense amplifier of FIG. 1 in accordance with aspects of the present invention. The table of FIG. 2 shows the states of NMOS devices T3-T7 at different time instances $X_0$-$X_4$. The time instances may be across approximately 0.5 nanoseconds. The states of the devices are based on the assumption that the DLC is being discharged, e.g., a differential signal representing the binary bit of 1 is produced by a memory cell connected a sense amplifier.

As shown in FIG. 2, the states of the NMOS devices T6 and T5 are such that NMOS device T6 reaches a deep saturation (DS) region faster than the NMOS device T5, since the NMOS device T6 is connected to the DLT having a higher voltage that the DLC. For example, the NMOS device T6 reaches the DS region at time instance $X_1$, whereas the NMOS device T5 reaches the DS region at time instance $X_2$. Further, the NMOS device T6 transitions to the saturation (S) region and linear reaches (L) at times $X_2$-$X_4$, whereas the NMOS device T5 transitions to the shallow off (SO) and off (O) regions at $X_3$-$X_4$ as the conducting by the NMOS device T6 discharges the lower voltage line connected to the NMOS device T5.

As further shown in FIG. 2, the NMOS device T4, which is part of the NMOS stack including the NMOS device T6, transitions from the off region to the linear region over time instances $X_0$-$X_4$. The NMOS device T3, which is part of the NMOS stack including the NMOS device T5, remains in either the off or deep off regions over time instances $X_0$-$X_4$. The NMOS device T7, which is connected to the SET line, transitions from the off region to the linear region over time instances $X_0$-$X_4$.

Figure 3:
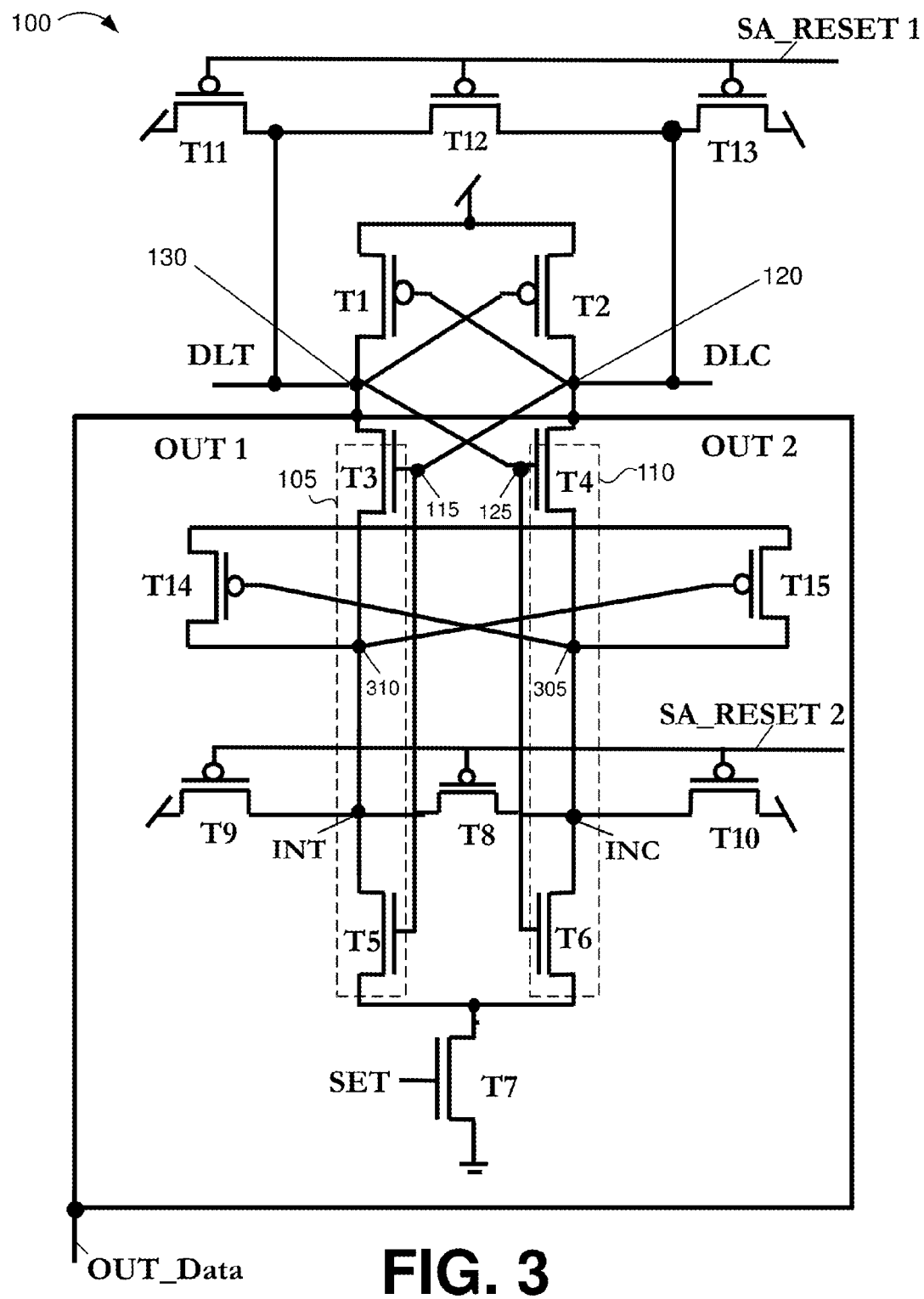
FIG. 3 shows another example sense amplifier in accordance with aspects of the present invention.

FIG. 3 shows another example sense amplifier in accordance with aspects of the present invention. As shown in FIG. 3, the sense amplifier 100 may include PMOS devices T14 and T15. The PMOS device T14 is cross coupled to the second stack of NMOS devices 110 at node 305. The PMOS device T15 is cross coupled to the first stack of NMOS devices 105 at node 310. The PMOS devices T14 and T15 may further improve amplification speed by holding the intermediate node at a high voltage. For example, assuming the DLC is discharged form a memory cell, T14 will turn on, and hold the intermediate node INT at a higher voltage.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A sense amplifier device comprising:
a first n-type metal-oxide-semiconductor field-effect transistor (NMOS) stack having a plurality of NMOS devices sharing a gate connection connected to a complementary data line; and
a second NMOS stack having a plurality of NMOS devices sharing a gate connection connected to a true data line,
wherein at least one of the NMOS devices in the first NMOS stack has a higher gate-to-source voltage and a higher drain-to-source voltage than a gate-to-source voltage and a drain-to-source voltage of at least one of the NMOS devices in the second NMOS stack when the voltage of the complementary data line is higher than the voltage of the true data line, and
wherein the at least one of the NMOS devices in the second NMOS stack has a higher gate-to-source voltage and a higher drain-to-source voltage than the gate-to-source voltage and the drain-to-source voltage of the at least of the NMOS device in the first NMOS stack when the voltage of the true data line is higher than the voltage of the complementary data line.

2. The sense amplifier device of claim 1, further comprising:
a plurality of pre-charge p-type metal-oxide-semiconductor field-effect transistor (PMOS) devices connected in series between the plurality of first and second NMOS devices configured to pre-charge a first node connecting the plurality of first devices with the plurality of pre-charge PMOS devices and a second node connecting the plurality of second devices with the plurality of PMOS devices.

3. The sense amplifier device of claim 2, further comprising: a plurality of pre-charge PMOS devices to pre-charge the complementary data line and the true data line.

4. The sense amplifier device of claim 1, wherein the plurality of first NMOS devices are cross-coupled to the complementary data line, and the plurality of second NMOS devices are cross-coupled to the true data line.

5. The sense amplifier device of claim 1, wherein:
the first NMOS stack amplifies a differential signal produced by a memory cell represented by a higher voltage on the complementary data line than a voltage on the true data line, and
the second NMOS stack amplifies a differential signal produced by the memory cell represented by a higher voltage on the true data line than a voltage on the complementary data line.

6. The sense amplifier device of claim 5, wherein the memory cell is associated with a static random access memory (SRAM) device.

7. The sense amplifier device of claim 1, wherein:
the plurality of first NMOS devices includes exactly two NMOS devices, and
the plurality of second NMOS devices includes exactly two NMOS devices.

8. A sense amplifier device for sensing a differential signal produced by a memory cell comprising:
a first n-type metal-oxide-semiconductor field-effect transistor (NMOS) stack having two NMOS devices sharing a gate connection connected to a complementary data line; and
a second NMOS stack having two NMOS devices sharing a gate connection connected to a true data line,
wherein one of the NMOS devices in the first NMOS stack has a higher gate-to-source voltage and a higher drain-to-source voltage than a gate-to-source voltage and a drain-to-source voltage of at least one of the NMOS devices in the second NMOS stack when the voltage of the complementary data line is higher than the voltage of the true data line, and wherein one of the NMOS devices in the second NMOS stack has a higher gate-to-source voltage and a higher drain-to-source voltage than a gate-to-source voltage and a drain-to-source voltage of at least one of the NMOS devices in the first NMOS stack when the voltage of the true data line is higher than the voltage of the complementary data line.

9. The sense amplifier device of claim 8, further comprising:
a plurality of pre-charge p-type metal-oxide-semiconductor field-effect transistor (PMOS) devices connected in series between the NMOS devices in the first and second NMOS stacks and configured to pre-charge a first node connecting the NMOS devices of the first stack with the pre-charge PMOS devices and a second node connecting the plurality of NMOS devices of the second NMOS stack with the plurality of PMOS devices.

10. The sense amplifier device of claim 9, further comprising: a plurality of pre-charge PMOS devices to pre-charge the complementary data line and the true data line.

11. The sense amplifier device of claim 8, wherein the NMOS devices of the first NMOS stack are cross-coupled to the complementary data line, and the NMOS devices of the second NMOS stack are cross-coupled to the true data line.

12. The sense amplifier device of claim 8, wherein:
the first NMOS stack amplifies the differential signal produced by the memory cell represented by a higher voltage on the complementary data line than a voltage on the true data line, and
the second NMOS stack amplifies the differential signal produced by the memory cell represented by a higher voltage on the true data line than a voltage on the complementary data line.

13. The sense amplifier device of claim 12, wherein the memory cell is associated with a static random access memory (SRAM) device.

14. The sense amplifier device of claim 8, further comprising:
a first p-type metal-oxide-semiconductor field-effect transistor (PMOS) device connected to the two NMOS devices in the first NMOS stack configured to hold a voltage on a node associated with the first NMOS stack; and
a second PMOS device connected to the two NMOS devices in the second NMOS stack configured to hold a voltage on a node associated with the second NMOS stack.

15. A sense amplifier device comprising:
a first n-type metal-oxide-semiconductor field-effect transistor (NMOS) stack having exactly two NMOS devices sharing a gate connection connected to a complementary data line;
a second NMOS stack having exactly two NMOS devices sharing a gate connection connected to a true data line;
a first p-type metal-oxide-semiconductor field-effect transistor (PMOS) device connected to the two NMOS devices in the first NMOS stack configured to hold a voltage on a node associated with the first NMOS stack; and
a second PMOS device connected to the two NMOS devices in the second NMOS stack configured to hold a voltage on a node associated with the second NMOS stack,
wherein one of the NMOS devices in the first NMOS stack has a higher gate-to-source voltage and a higher drain-to-source voltage than a gate-to-source voltage and a drain-to-source voltage of at least one of the NMOS devices in the second NMOS stack when the voltage of the complementary data line is higher than the voltage of the true data line, and
wherein one of the NMOS devices in the second NMOS stack has a higher gate-to-source voltage and a higher drain-to-source voltage than a gate-to-source voltage and a drain-to-source voltage of at least one of the NMOS devices in the first NMOS stack when the voltage of the true data line is higher than the voltage of the complementary data line.

16. The sense amplifier device of claim 15, further comprising:
a plurality of pre-charge p-type metal-oxide-semiconductor field-effect transistor (PMOS) devices connected in series between the NMOS devices in the first and second NMOS stacks and configured to pre-charge a first node connecting the NMOS devices of the first stack with the pre-charge PMOS devices and a second node connecting the plurality of NMOS devices of the second NMOS stack with the plurality of PMOS devices.

17. The sense amplifier device of claim 15, further comprising a plurality of pre-charge PMOS devices configured to pre-charge the complementary data line and the true data line.

18. The sense amplifier device of claim 15, wherein the NMOS devices of the first NMOS stack are cross-coupled to the complementary data line, and the NMOS devices of the second NMOS stack are cross-coupled to the true data line.

19. The sense amplifier device of claim 15, wherein:
the first NMOS stack amplifies a differential signal produced by a memory cell represented by a higher voltage on the complementary data line than a voltage on the true data line, and
the second NMOS stack amplifies a differential signal produced by the memory cell represented by a higher voltage on the true data line than a voltage on the complementary data line.

20. The sense amplifier device of claim 19, wherein the memory cell is associated with a static random access memory (SRAM) device.

* * * * *